US008601655B2

(12) United States Patent
Barber et al.

(10) Patent No.: US 8,601,655 B2
(45) Date of Patent: Dec. 10, 2013

(54) PROCESS OF MAKING A BULK ACOUSTIC WAVE STRUCTURE WITH AN ALUMINUM COPPER NITRIDE PIEZOELECTRIC LAYER

(75) Inventors: Bradley P. Barber, Acton, MA (US); Paul P. Gehlert, Sterling, MA (US); Christopher F. Shepard, Nashua, NH (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 986 days.

(21) Appl. No.: 12/221,273

(22) Filed: Aug. 1, 2008

(65) Prior Publication Data
US 2009/0045703 A1  Feb. 19, 2009

Related U.S. Application Data

(60) Provisional application No. 60/964,648, filed on Aug. 14, 2007.

(51) Int. Cl.
H04R 17/10 (2006.01)
C04B 35/622 (2006.01)

(52) U.S. Cl.
USPC ....... 29/25.35; 29/846; 264/430; 252/62.9 PZ

(58) Field of Classification Search
USPC ................ 29/25.35, 594, 846, 831; 427/100; 264/429, 430; 252/62.9 R, 62.9 PZ
See application file for complete search history.

(56) References Cited

U.S. PATENT DOCUMENTS

| 3,363,119 | A | 1/1968 | Koneval et al. | |
|---|---|---|---|---|
| 3,365,591 | A | 1/1968 | Curran et al. | |
| 3,401,276 | A | 9/1968 | Curran et al. | |
| 5,112,642 | A | * 5/1992 | Wajid | 427/100 |
| 6,182,340 | B1 | * 2/2001 | Bishop | 29/25.35 |
| 6,420,202 | B1 | 7/2002 | Barber et al. | |
| 6,812,619 | B1 | 11/2004 | Kaitila et al. | |
| 6,933,809 | B2 | 8/2005 | Kyoung et al. | |
| 7,323,953 | B2 | 1/2008 | Yokoyama et al. | |
| 7,482,737 | B2 | 1/2009 | Yamada et al. | |
| 2002/0121840 | A1 | 9/2002 | Larson et al. | |
| 2004/0164462 | A1 | * 8/2004 | Wada et al. | 264/429 |
| 2005/0140247 | A1 | 6/2005 | Lee | |
| 2006/0103492 | A1 | 5/2006 | Feng et al. | |
| 2008/0157629 | A1 | 7/2008 | Noguchi et al. | |
| 2009/0045704 | A1 | 2/2009 | Barber et al. | |

FOREIGN PATENT DOCUMENTS

| JP | 63112499 A | * 5/1988 | 427/100 |
|---|---|---|---|
| JP | 2007-110281 A | 4/2007 | |
| KR | 10-2005-0010710 A | 1/2005 | |
| WO | 2005008889 | 1/2005 | |

* cited by examiner

Primary Examiner — A. Dexter Tugbang

(57) ABSTRACT

According to an exemplary embodiment, a bulk acoustic wave structure includes a lower electrode situated over a substrate. The bulk acoustic wave structure further includes a piezoelectric layer situated over the lower electrode, where the piezoelectric layer comprises aluminum copper nitride. The bulk acoustic wave structure further includes an upper electrode situated over the lower electrode. The bulk acoustic wave structure can further include a bond pad connected to the upper electrode, where the bond pad comprises aluminum copper. The lower electrode can include a high density metal situated adjacent to the piezoelectric layer and a high conductivity metal layer underlying the high density metal layer.

17 Claims, 3 Drawing Sheets

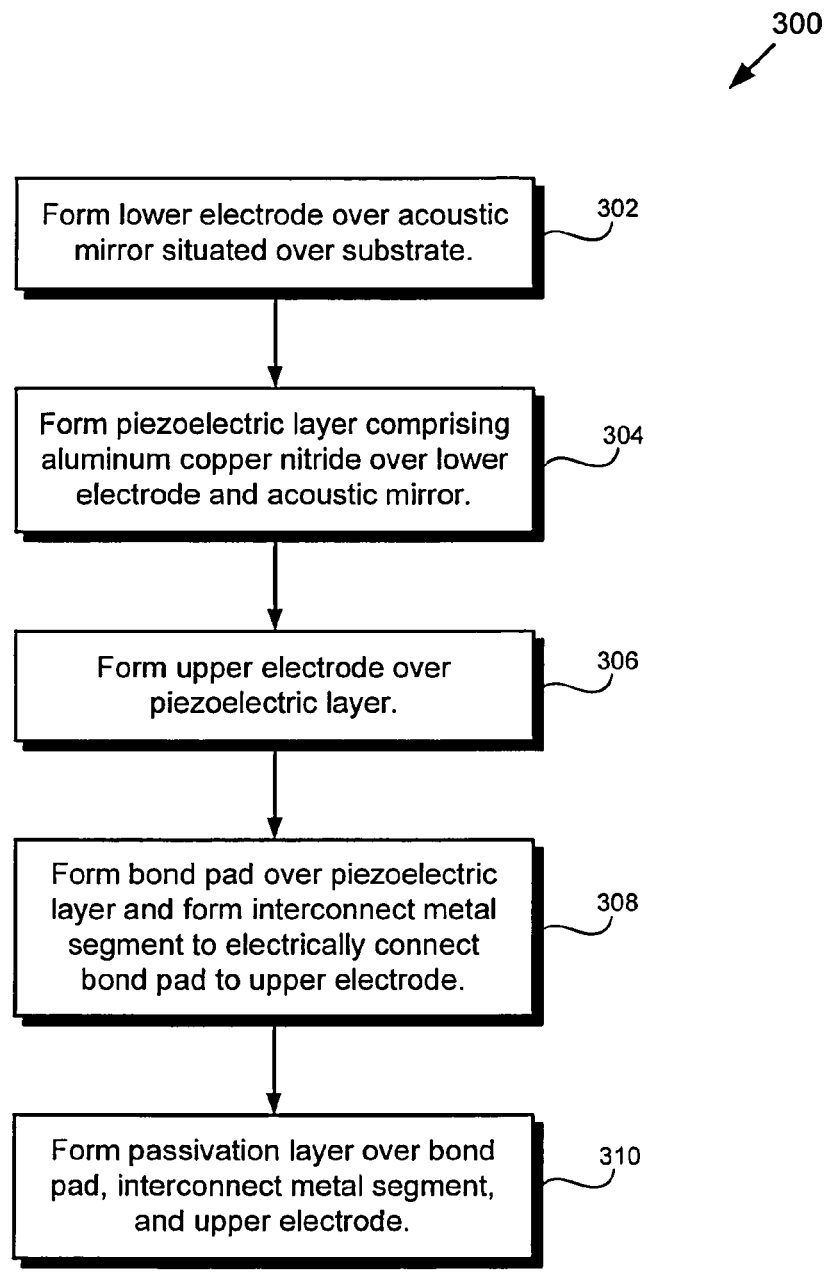

PROCESS OF MAKING A BULK ACOUSTIC WAVE STRUCTURE WITH AN ALUMINUM COPPER NITRIDE PIEZOELECTRIC LAYER

The present application claims the benefit of and priority to a now abandoned provisional patent application entitled "Aluminum Copper Nitride Piezoelectric Film," Ser. No. 60/964,648 filed on Aug. 14, 2007. The disclosure in that pending provisional application is hereby incorporated fully by reference into the present application.

BACKGROUND OF THE INVENTION

1. Field of the Invention

The present invention generally relates to the field of semiconductor fabrication. More particularly, the invention relates to the fabrication of acoustic wave structures in semiconductor dies.

2. Background Art

Bulk acoustic wave (BAW) structures, which can be used in frequency control or filtering applications, can include a piezoelectric layer sandwiched between upper and lower electrodes and an underlying acoustic mirror. When an electric field is applied across the piezoelectric layer via the upper and lower electrodes, electrical energy is converted into acoustic energy in the piezoelectric layer through electromechanical coupling, thereby causing the piezoelectric layer to vibrate and generated acoustic waves. The acoustic mirror, which can include a number of alternating dielectric and metal layers, can be used to trap acoustic energy in the piezoelectric layer by reflecting acoustic energy, thereby preventing acoustic energy loss through transmission into the substrate.

In a conventional BAW structure, such as a BAW resonator, the piezoelectric layer can comprise zinc oxide (ZnO), aluminum nitride (AlN), or other suitable piezoelectric material and the upper and lower electrodes can comprise a high density metal, such as molybdenum (Mo) or tungsten (W), for increased electromechanical coupling. The conventional BAW structure typically utilizes aluminum copper (AlCu) metallization for bond pads and the like, since copper in the aluminum copper reduces undesirable electromigration. However, fabrication of a conventional BAW structure, such as a BAW resonator, requires one process chamber for forming the piezoelectric layer and another process chamber for forming the aluminum copper metallization used in the BAW resonator, which can undesirably reduce manufacturing efficiency and increase manufacturing cost.

SUMMARY OF THE INVENTION

A bulk acoustic wave structure with aluminum copper nitride piezoelectric layer and related method, substantially as shown in and/or described in connection with at least one of the figures, as set forth more completely in the claims.

BRIEF DESCRIPTION OF THE DRAWINGS

FIG. 3 shows a flowchart illustrating the exemplary steps taken to implement one embodiment of the present invention.

DETAILED DESCRIPTION OF THE INVENTION

The present invention is directed to a bulk acoustic wave structure with aluminum copper nitride piezoelectric layer and related method. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention which use the principles of the present invention are not specifically described in the present application and are not specifically illustrated by the present drawings.

Figure 1:
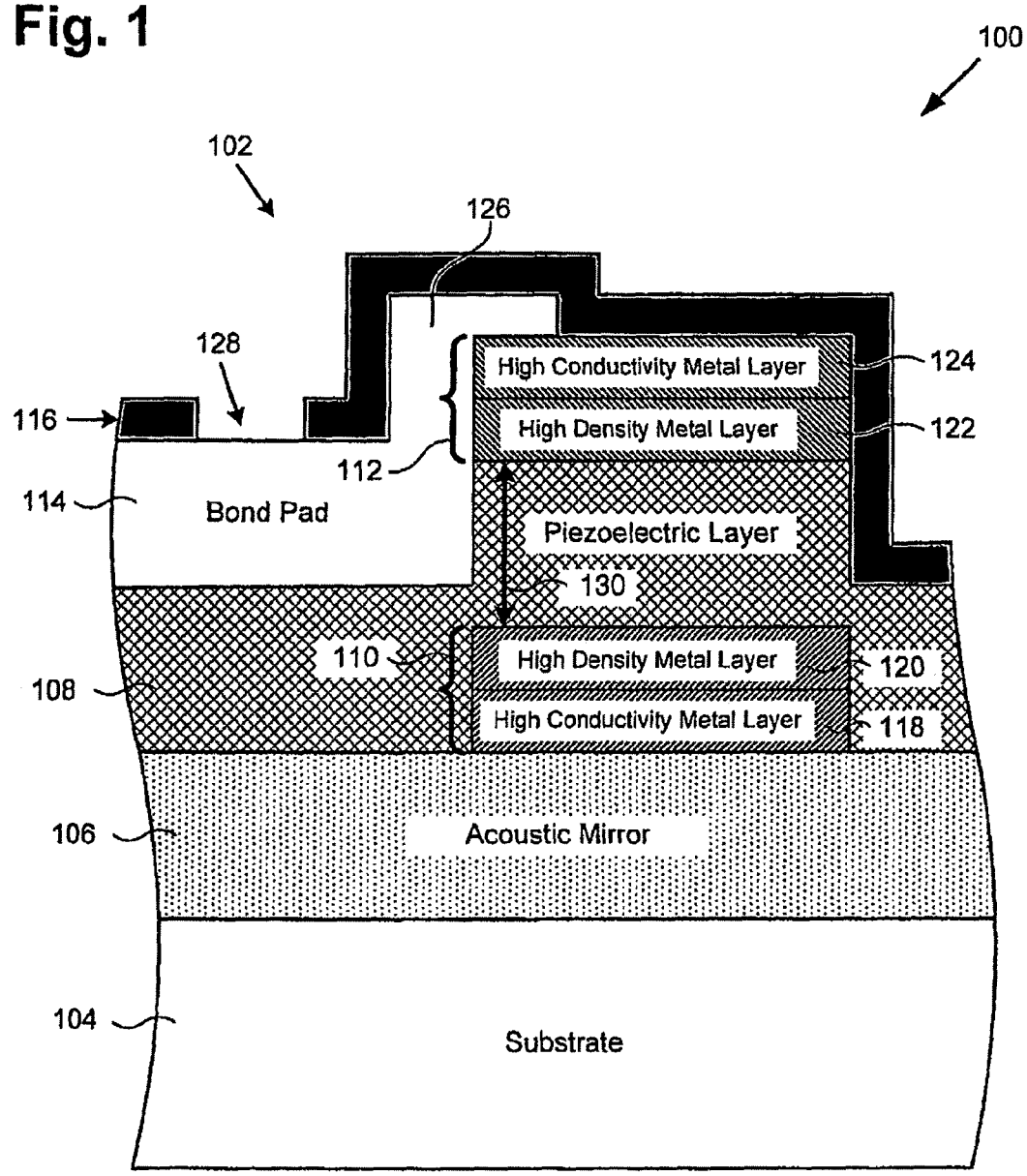
FIG. 1 illustrates a cross-sectional view of an exemplary bulk acoustic wave structure including an exemplary piezoelectric layer in accordance with one embodiment of the present invention.

FIG. 1 shows a cross-sectional view of a semiconductor die including an exemplary BAW structure in accordance with one embodiment of the present invention. Certain details and features have been left out of FIG. 1, which are apparent to a person of ordinary skill in the art. In FIG. 1, structure 100 includes BAW structure 102 on substrate 104. BAW structure 102 includes acoustic mirror 106, piezoelectric layer 108, lower electrode 110, upper electrode 112, bond pad 114, and passivation layer 116. Lower electrode 110 includes high conductivity metal layer 118 and high density metal layer 120 and upper electrode 112 includes high density metal layer 122 and high conductivity metal layer 124. In other embodiments, lower electrode 110 and/or upper electrode 112 can include only a high density metal layer, such as high density metal layer 120 or 122.

BAW structure 102, which can be a BAW resonator, can be used in a BAW filter, such as a BAW RF filter, or as a resonator in a frequency control circuit, for example. In one embodiment, BAW structure 102 can be a film bulk acoustic resonator (FBAR), wherein a sacrificial layer can be utilized in place of acoustic mirror 106. In such embodiment, the sacrificial layer can be partially removed to form an air cavity for providing acoustic isolation from substrate 104. It is noted that although not shown in FIG. 1, lower electrode 110 can also be connected to a bond pad, such as bond pad 114.

As shown in FIG. 1, acoustic mirror 106 is situated over substrate 104, which can comprise, for example, high resistivity silicon. Acoustic mirror 106 provides acoustical isolation between BAW structure 102 and substrate 104 and can comprise a selected number of alternating dielectric and metal layers, where each dielectric layer, which can comprise, for example, silicon oxide, provides a low acoustic impedance layer and each metal layer, which can comprise a high density metal, such as tungsten (W), provides a high acoustic impedance layer. In acoustic mirror 106, for example, each dielectric layer can be formed by using a chemical vapor deposition (CVD) process and each metal layer can be formed by using a physical vapor deposition (PVD) process.

Also shown in FIG. 1, high conductivity metal layer 118 is situated over acoustic mirror 106, high density metal layer 120 is situated over high conductivity metal layer 118, and piezoelectric layer 108 is situated over acoustic mirror 106 and high density metal layer 120. In the present embodiment, high conductivity metal layer 118 can comprise aluminum copper (AlCu), which can comprise between 0.2 percent and 5.0 percent copper to reduce undesirable electromigration. In another embodiment, high conductivity metal layer 118 can comprise aluminum, gold, or other suitable high conductivity metal or metal alloy. High conductivity metal layer 118 can be formed by depositing a layer of aluminum copper over acoustic mirror 106 in a process chamber by using a PVD process or other suitable deposition process. High density metal layer 120 can comprise tungsten, molybdenum, or other suitable high density metal and can be formed by depositing a layer of a high density metal, such as tungsten or molybdenum, over high conductivity metal layer 118 by using a PVD process or other suitable deposition process.

In the present invention, piezoelectric layer 108 comprises aluminum copper nitride (AlCuN) and has thickness 130 which can be between 0.7 microns and 2.0 microns in one embodiment. Piezoelectric layer 108 can be formed by depositing a layer of aluminum copper nitride over acoustic mirror 106 and high density metal layer 120 by using a PVD process or other suitable deposition process. By ensuring that the grain structure of high density metal layer 120 is properly oriented, the present invention can provide a piezoelectric layer (i.e. piezoelectric layer 108) having a highly textured grain structure on lower electrode 110. By utilizing aluminum copper nitride to form piezoelectric layer 108, the invention can achieve a BAW structure having equivalent resonator performance compared to a BAW structure utilizing a conventional piezoelectric layer comprising aluminum nitride.

Also, by utilizing appropriate target cleaning and target seasoning procedures, the invention's aluminum copper nitride piezoelectric layer can be deposited in the same process chamber that is utilized to deposit aluminum copper metallization in BAW structure 102. For example, the same process chamber can be utilized to deposit piezoelectric layer 108, bond pad 114, which can comprise aluminum copper, and high conductivity metal layers 118 and 124, which can also comprise aluminum copper. In an embodiment in which lower electrode 110 and upper electrode 112 do not comprise a layer of aluminum copper, piezoelectric layer 108 and bond pad 114 can be formed in the same process chamber.

Also shown in FIG. 1, high density metal layer 122 is situated over piezoelectric layer 108 and can comprise tungsten, molybdenum, or other suitable high density metal. High density metal layer 122 can be formed by depositing a layer of a high density metal, such as tungsten or molybdenum, over piezoelectric layer 108 by utilizing a PVD process or other suitable deposition process. Further shown in FIG. 1, high conductivity metal layer 124 is situated over high density metal layer 122 can comprise aluminum copper, which can comprise between 0.2 percent and 5.0 percent copper to reduce undesirable electromigration. In another embodiment, high conductivity metal layer 124 can comprise aluminum, gold, or other suitable high conductivity metal or metal alloy. High conductivity metal layer 124 can be formed by depositing a layer of aluminum copper over high density metal layer 122 by utilizing a PVD process or other suitable deposition process in the same process chamber that is used to form piezoelectric layer 108.

Further shown in FIG. 1, bond pad 114 is situated over piezoelectric layer 108 and interconnect metal segment 126 is situated over bond pad 114 and high conductivity metal layer 124 and electrically connects bond pad 114 to upper electrode 112. In the present embodiment, bond pad 114 and interconnect metal segment 126 can comprise aluminum copper, which can comprise between 0.2 percent and 5.0 percent copper to reduce undesirable electromigration. In one embodiment, bond pad 114 and interconnect metal segment 126 can comprise aluminum, gold, or other suitable metal or metal alloy. In the present embodiment, bond pad 114 and interconnect metal segment 126 can be formed by depositing a layer of aluminum copper over upper electrode 112 by utilizing a PVD process in the same process chamber that is utilized to form piezoelectric layer 108.

Also shown in FIG. 1, passivation layer 116 is situated over bond pad 114, interconnect metal segment 126, and upper electrode 112 and can comprise silicon nitride or other suitable dielectric material. Passivation layer 116 can be formed by, for example, depositing a layer of silicon nitride over bond pad 114, interconnect metal segment 126, and upper electrode 112 by utilizing a CVD process or other suitable deposition process. Further shown in FIG. 1, opening 128 is situated in passivation layer 116 to expose bond pad 114 and can be formed by appropriately patterning passivation layer 116.

The simplified discussion of a BAW resonator provided above illustrates the idea of fabricating BAW devices comprised of piezoelectric films between metallic electrodes and shows that during the device fabrication, one can require both metallic aluminum copper and piezoelectric films for different functionality. One can clearly expand the description to more generalized BAW devices whereby the processes described above can be repeatedly applied resulting in multiple layers of electroded piezo material stacked in succession, perhaps with interposing layers, to attain a different desired electrical functionality. These generalized multiple piezoelectric film devices are often referred to as stacked crystal or coupled resonator devices.

Thus, in the present embodiment, by forming a piezoelectric layer comprising aluminum copper nitride, a single process chamber can be utilized to form piezoelectric layer 108 and aluminum copper metallization for bond pad 114, interconnect metal segment 126, and high conductivity metal layers 118 and 124. In contrast, in a conventional BAW structure utilizing a conventional piezoelectric material such as aluminum nitride (AlN) or zinc oxide (ZnO) and aluminum copper metallization for bond pads and the like, different process chambers are required to form the piezoelectric layer and the aluminum copper metallization. As a result, the present invention can advantageously provide a BAW structure with increased manufacturing efficiency and reduced manufacturing cost compared to a conventional BAW structure with a conventional piezoelectric layer and aluminum copper metallization by reducing the operating costs associated with an additional process chamber. Alternatively, by forming a piezoelectric layer comprising aluminum copper nitride, the present invention can utilize two process chambers with aluminum copper interchangeably to advantageously provide fabrication redundancy.

Figure 2:
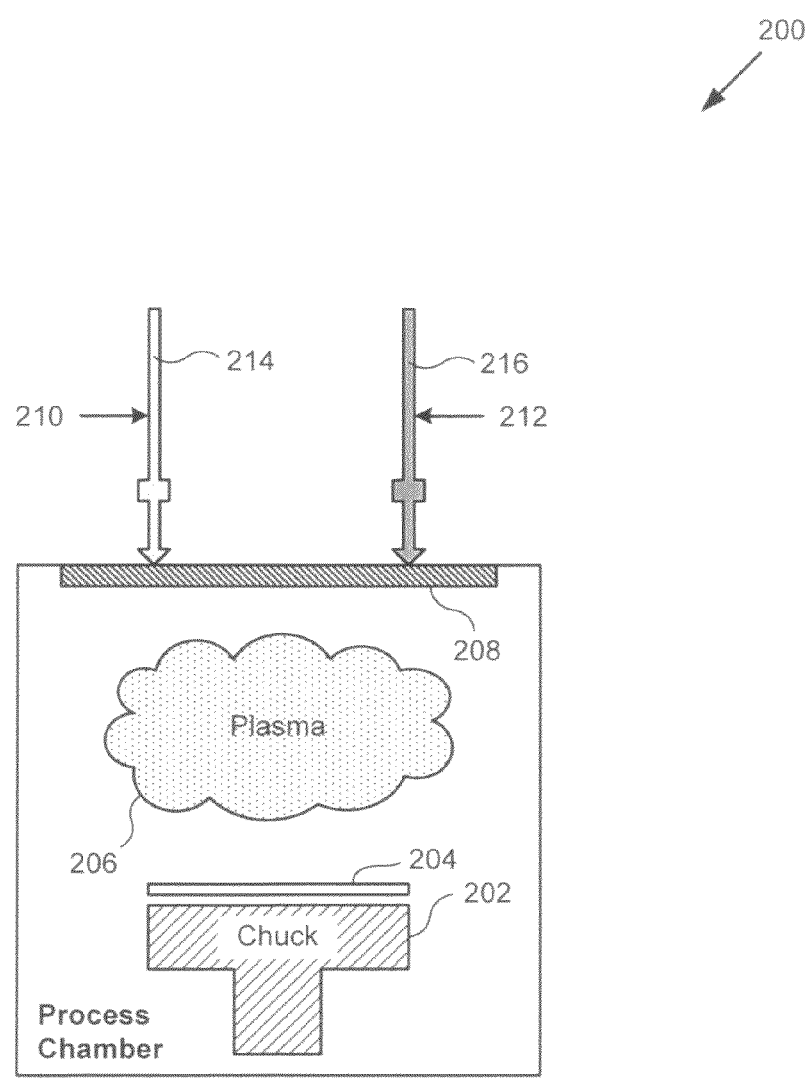
FIG. 2 is a diagram of an exemplary process chamber utilized in the formation of an exemplary bulk acoustic wave structure in accordance with one embodiment of the present invention.

FIG. 2 shows a diagram of a process chamber during formation of an exemplary piezoelectric layer in accordance with one embodiment of the present invention. Certain details and features have been left out of FIG. 2, which are apparent to a person of ordinary skill in the art. In FIG. 2, process chamber 200 is shown during the formation of a piezoelectric layer, such as piezoelectric layer 108 in FIG. 1, for an embodiment of the invention's BAW structure, such as BAW structure 102. Process chamber 200 includes wafer chuck 202, wafer 204, plasma 206, metal target 208, and gas input lines 210 and 212. Process chamber 200 can be utilized for performing, for example, a PVD process.

As shown in FIG. 2, wafer 204 is mounted on wafer chuck 202, which can be, for example, an electrostatic chuck. Wafer 204 can include a substrate, such as substrate 104, an acoustic mirror, such as acoustic mirror 106, overlying the substrate, and a lower electrode, such as lower electrode 110, overlying the acoustic mirror. Also shown in FIG. 2, plasma 206 is formed between wafer 204 and metal target 208 and can comprise argon and nitrogen ions. In the present embodiment, metal target 208 can comprise aluminum copper, which can comprise between 0.2 percent and 5.0 percent copper, and can be electrically negative compared to wafer chuck 202 and the walls of process chamber 200. In one embodiment, metal target 208 can comprise aluminum copper having approximately 0.5 percent copper. Further shown in FIG. 2, gas input lines 210 and 212 are connected to process chamber 200 and can supply respective gases 214 and 216. In the present embodiment, gas 214 can be argon and gas 216 can be nitrogen.

During the formation of a piezoelectric layer, such as piezoelectric layer 108, in the embodiment in FIG. 2, argon and nitrogen gases are supplied to process chamber 200. Plasma 206, which is formed in process chamber 200, includes argon and nitrogen ions. The argon ions, which have a positive charge, are accelerated toward the negatively charged aluminum copper target, thereby dislodging aluminum and copper atoms in a scattering process. The aluminum and copper atoms can combine with the nitrogen atoms to form a layer of aluminum copper nitride (AlCuN) on the surface of wafer 204. The resulting aluminum copper nitride layer can have a thickness of between 0.7 microns and 2.0 microns, in one exemplary embodiment.

By performing appropriate procedures to clean and season metal target 208, process chamber 200 can be utilized to deposit aluminum copper on wafer 204 to form bond pads, such as bond pad 114, and metal interconnect segments, such as interconnect metal segment 126, in BAW structure 102. For example, during the formation of bond pads comprising aluminum copper, such as bond pad 114, argon gas can be supplied to process chamber 200 by gas input line 210 and gas input line 212 can be turned off to prevent nitrogen from entering the process chamber. A plasma comprising argon ions can then formed in process chamber 200. The argon ions, which have a positive charge, can be accelerated toward the negatively charged aluminum copper target, thereby dislodging aluminum and copper atoms in a scattering process. The aluminum and copper atoms can form a layer of aluminum copper on the surface of wafer 204, which can be appropriately patterned to form bond pads, such as bond pad 114. In the present embodiment, process chamber 200 can also be utilized to form high conductivity metal layers comprising aluminum copper, such as high conductivity metal layer 118 in lower electrode 110 and high conductivity metal layer 124 in upper electrode 112.

By utilizing an aluminum copper target to form a piezoelectric layer comprising aluminum copper nitride, the invention eliminates the requirement of a process chamber with a substantially pure aluminum target, which is required to form a conventional aluminum nitride piezoelectric layer. As a result, a single process chamber with an aluminum copper target can be utilized in the present invention to form a piezoelectric layer and to form aluminum copper metallization for bond pads, interconnect metal segments, and the like. As a consequence, the invention provides a more efficient process for forming a BAW structure, such as BAW structure 102 in FIG. 1, compared to a conventional BAW structure comprising a conventional piezoelectric layer.

FIG. 3 shows flowchart 300, which describes the steps, according to one embodiment of the present invention, of a process for fabricating BAW structure 102 in FIG. 1. Certain details and features have been left out of flowchart 300 that are apparent to a person of ordinary skill in the art. For example, a step may consist of one or more substeps or may involve specialized equipment or materials, as known in the art. Steps 302 through 310 indicated in flowchart 300 are sufficient to describe one embodiment of the present invention; other embodiments of the invention may utilize steps different from those shown in flowchart 300.

At step 302 of flowchart 300, lower electrode 110 is formed over acoustic mirror 106, which is situated over substrate 104. In the present embodiment, lower electrode 110 can comprise high density metal layer 120, which can comprise a high density metal such as tungsten or molybdenum, and underlying high conductivity metal layer 120, which can comprise aluminum copper. Lower electrode 110 can be formed by utilizing a PVD process or other suitable deposition process to deposit a layer of aluminum copper over acoustic mirror 106 to form high conductivity metal layer 118. A PVD process or other suitable deposition process can then be utilized to deposit a layer of high density metal, such as tungsten or molybdenum, over the layer of aluminum copper to form high density metal layer 120. High conductivity metal layer 118 can be formed in a process chamber, such as process chamber 200 in FIG. 2.

At step 304, piezoelectric layer 108, which comprises aluminum copper nitride, is formed over lower electrode 110 and acoustic mirror 106. Piezoelectric layer 108 can be formed by depositing a layer of aluminum copper nitride over high density metal layer 120 of lower electrode 110 by utilizing a PVD process in a process chamber, such as process chamber 200. In the present embodiment, piezoelectric layer 108 and high conductivity metal layer 118 can be formed in the same process chamber.

At step 306, upper electrode 112 is formed over piezoelectric layer 108. In the present embodiment, upper electrode 112 can comprise high density metal layer 122, which can comprise a high density metal such as tungsten or molybdenum, and overlying high conductivity metal layer 124, which can comprise aluminum copper. Upper electrode 112 can be formed by utilizing a PVD process to deposit a layer of high density metal, such as tungsten or molybdenum, over piezoelectric layer 108 to form high density metal layer 122. A PVD process can then be utilized to deposit a layer of aluminum copper over the layer of high density metal to form high conductivity metal layer 124. High conductivity metal layer 124 can be formed in a process chamber, such as process chamber 200. In the present embodiment, high conductivity metal layers 118 and 124 and piezoelectric layer 108 can be formed in the same process chamber.

At step 308, bond pad 114 is formed over piezoelectric layer 108 and interconnect metal segment 126 is formed over bond pad 114 and upper electrode 112 to electrically connect bond pad 114 to upper electrode 112. Bond pad 114 can comprise aluminum copper and can be formed by utilizing a PVD process or other suitable deposition process to deposit aluminum copper over piezoelectric layer 108. Interconnect metal segment 126 can also comprise aluminum copper and can be formed by utilizing a PVD process or other suitable deposition process to deposit aluminum copper over bond pad 114 and upper electrode 112. In the present embodiment, bond pad 114, interconnect metal segment 126, high conductivity metal layers 118 and 124, and piezoelectric layer 108 can be formed in the same process chamber, such as process chamber 200.

At step 310, passivation layer 116 is formed over bond pad 114, interconnect metal segment 126, and upper electrode 112. Passivation layer 116 can comprise silicon nitride or other suitable dielectric material and can be formed by utilizing a CVD process or other suitable deposition process to deposit, for example, a layer of silicon nitride over bond pad 114, interconnect metal segment 126, and upper electrode 112.

Thus, as discussed above, by forming a BAW structure including a piezoelectric layer comprising aluminum copper nitride, the invention can utilize a single process chamber for forming the piezoelectric layer and aluminum copper metallization for bond pads, interconnect metal segments, and the like. As a result, the invention advantageously achieves a BAW structure that can be formed with increased manufacturing efficiency and reduced manufacturing cost compared to a conventional BAW structure with a conventional piezoelectric layer comprising aluminum nitride and aluminum copper metallization by reducing operating costs associated with an additional process chamber. Also, by forming an aluminum copper nitride piezoelectric layer in a BAW structure, the invention advantageously achieves increased electromechanical coupling compared to a conventional BAW structure utilizing a conventional aluminum nitride piezoelectric layer.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

The invention claimed is:

1. A method of forming a BAW structure, the method comprising:
    forming a lower electrode over a substrate;
    forming a piezoelectric layer over said lower electrode, said piezoelectric layer comprising aluminum copper nitride; and
    forming an upper electrode over said piezoelectric layer.

2. The method of claim 1, further comprising forming a bond pad connected to said upper electrode, wherein said bond pad and said piezoelectric layer are formed in a same process chamber.

3. The method of claim 2, wherein said bond pad comprises aluminum copper.

4. The method of claim 1, wherein said lower electrode comprises a high conductivity metal layer underlying a high density metal layer, wherein said high conductivity metal layer and said piezoelectric layer are formed in a same process chamber.

5. The method of claim 1, wherein said upper electrode comprises a high conductivity metal layer overlying a high density metal layer, wherein said high conductivity metal layer and said piezoelectric layer are formed in a same process chamber.

6. The method of claim 1, wherein said piezoelectric layer is formed in a process chamber utilizing an aluminum copper target comprising between 0.2 percent copper and 5.0 percent copper.

7. A method of forming a BAW structure, the method comprising:
    forming a lower electrode over a substrate;
    forming a piezoelectric layer over the lower electrode, the piezoelectric layer including aluminum copper nitride; and
    forming an upper electrode over the piezoelectric layer,
    at least one of the lower electrode and the upper electrode includes an AlCu layer formed in a same process chamber as the piezoelectric layer.

8. The method of claim 7, wherein the process chamber includes an AlCu target used to form the piezoelectric layer and the at least one of the lower electrode and the upper electrode.

9. The method of claim 8, wherein the AlCu target includes between 0.2 and 5.0 percent Cu.

10. The method of claim 8, further comprising cleaning and seasoning the AlCu target after said forming the piezoelectric layer.

11. The method of claim 7, wherein the upper electrode includes the AlCu layer.

12. The method of claim 7, wherein the lower electrode includes the AlCu layer.

13. The method of claim 7, wherein both the lower and upper electrodes include the AlCu layer.

14. The method of claim 7, further comprising forming a bond pad connected to the upper electrode, wherein the bond pad includes another AlCu layer also formed in the same process chamber.

15. A method of forming a BAW structure, the method comprising:
    forming a lower electrode over a substrate, the lower electrode including a first high density metal layer over a first high conductivity metal layer;
    forming a piezoelectric layer over said lower electrode, the piezoelectric layer including aluminum copper nitride;
    forming an upper electrode over said piezoelectric layer, the upper electrode including a second high conductivity metal layer over a second high density metal layer; and
    forming a bond pad over the piezoelectric layer and the upper electrode,
    wherein the first and second high conductivity metal layers and the bond pad are AlCu layers formed in a same process chamber as the piezoelectric layer using an AlCu target.

16. The method of claim 15, wherein the AlCu target includes between 0.2 and 5.0 percent Cu.

17. The method of claim 15, further comprising cleaning and seasoning the AlCu target after said forming the piezoelectric layer.

* * * * *